(12) United States Patent
Koo et al.

(10) Patent No.: US 11,037,484 B2
(45) Date of Patent: Jun. 15, 2021

(54) DISPLAY DEVICE

(71) Applicant: Samsung Display Co., Ltd., Yongin-Si (KR)

(72) Inventors: Bon-Yong Koo, Cheonan-si (KR); Dong Yeon Son, Asan-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/502,438

(22) Filed: Jul. 3, 2019

(65) Prior Publication Data

US 2019/0325811 A1    Oct. 24, 2019

Related U.S. Application Data

(63) Continuation of application No. 15/476,213, filed on Mar. 31, 2017, now Pat. No. 10,388,208, which is a continuation of application No. 14/274,541, filed on May 9, 2014, now Pat. No. 9,627,415.

(30) Foreign Application Priority Data

Jan. 7, 2014    (KR) ........................ 10-2014-0001803

(51) Int. Cl.
*G09G 3/20*  (2006.01)
*G09G 3/36*  (2006.01)
*H01L 27/12*  (2006.01)

(52) U.S. Cl.
CPC ......... *G09G 3/2092* (2013.01); *G09G 3/3677* (2013.01); *H01L 27/124* (2013.01); *G09G 2300/0426* (2013.01); *G09G 2310/0286* (2013.01); *G09G 2310/08* (2013.01)

(58) Field of Classification Search
CPC .............. G09G 3/2092; G09G 3/3677; G09G 2300/0426; G09G 2310/08; G09G 2310/0286; H01L 27/124
See application file for complete search history.

(56) References Cited

U.S. PATENT DOCUMENTS

| | | | |
|---|---|---|---|
| 6,594,170 B2 | 7/2003 | Kudou et al. | |
| 7,379,148 B2 | 5/2008 | Kim | |
| 7,522,145 B2 | 4/2009 | Lee et al. | |
| 8,334,719 B2 | 12/2012 | Koyama et al. | |
| 2011/0279358 A1 | 11/2011 | Lee et al. | |
| 2012/0038616 A1* | 2/2012 | Song | G09G 3/003 345/212 |
| 2012/0168762 A1 | 7/2012 | Kikuchi et al. | |
| 2012/0327057 A1* | 12/2012 | Sakamoto | G11C 19/28 345/211 |

FOREIGN PATENT DOCUMENTS

KR    10-0899628 B1    5/2009

\* cited by examiner

*Primary Examiner* — Benjamin Tzu-Hung Liu
(74) *Attorney, Agent, or Firm* — Innovation Counsel LLP

(57) ABSTRACT

Provided is a display device, more particularly, a display device including a gate driver. The display device includes: a plurality of pixels; a plurality of gate lines connected to the plurality of pixels; a gate driver including a plurality of stages outputting gate signals to the plurality of gate lines; a clock signal wiring transferring a clock signal to the gate driver; a voltage wiring transferring an off voltage to the gate driver, in which the clock signal wiring is positioned at a first side of the gate driver, and the voltage wiring is positioned at a second side facing the first side of the gate driver.

21 Claims, 10 Drawing Sheets

DISPLAY DEVICE

CROSS-REFERENCE TO RELATED APPLICATION

This application is a continuation application of U.S. patent application Ser. No. 15/476,213 filed on Mar. 31, 2017, which is a continuation application of U.S. patent application Ser. No. 14/274,541 filed on May 9, 2014 (now U.S. Pat. No. 9,627,415), which claims priority to and the benefit of Korean Patent Application No. 10-2014-0001803 filed in the Korean Intellectual Property Office (KIPO) on Jan. 7, 2014, the contents of the prior applications being herein incorporated by reference.

BACKGROUND

(a) Technical Field

The inventive concept relates to a display device, and more particularly, to a display device including a gate driver.

(b) Description of the Related Art

Generally, a display device includes a plurality of pixels which are portions displaying images, and drivers. The drivers include a data driver applying a data voltage to the pixel, and a gate driver applying a gate signal to the pixel. The gate driver and the data driver may be mounted on a printed circuit board (PCB) as an IC chip and the PCB is connected to a display panel. The IC chip may be directly mounted on the display panel.

However, recently, in the case of a gate driver without requiring high mobility of a thin film transistor channel, a structure in which the gate driver is not formed by a separate chip, but integrated on the display panel has been developed.

The gate driver includes a shift register having a plurality of stages which are serially connected to each other, and a plurality of signal transferring wirings transferring a clock signal and a driving control signal having a low voltage and the like to the shift register.

Each of the plurality of stages is connected to respective gate line. Each of the plurality of stages sequentially outputs a gate signal to each gate line in a predetermined order.

The signal transferring wirings generally extend in a direction in which the plurality of stages is arranged.

The above information disclosed in this Background section is only for enhancement of understanding of the background of the inventive concept and therefore it may contain information that does not form the prior art.

SUMMARY

According to a layout of the stages of the gate driver and the plurality of signal transferring wirings transferring various driving control signals to the stages, any one signal transferring wiring and another signal wiring or a signal line connected therewith may overlap with each other and cross each other. As such, at a portion where the signal transferring wirings transferring different signals cross each other, a parasitic capacitor is formed, and thus a load of the signal transferring wirings may be increased. As a result, power consumption of the gate driver may be increased, and heat generation may be increased.

The inventive concept has been made in an effort to provide a display device having advantages of preventing a parasitic capacitor from being generated by reducing overlap between signal transferring wirings transferring a driving control signal to a gate driver and reduce power consumption of the gate driver by reducing a load of the signal transferring wirings. Particularly, the inventive concept has been made in an effort to provide a display device having advantages of reducing a load of a clock signal wiring transferring a clock signal to the gate driver.

An exemplary embodiment of the inventive concept provides a display device, including: a plurality of pixels; a plurality of gate lines connected to the plurality of pixels; a gate driver including a plurality of stages outputting gate signals to the plurality of gate lines; a clock signal wiring transferring a clock signal to the gate driver; a voltage wiring transferring an off voltage to the gate driver, in which the clock signal wiring is positioned at a first side of the gate driver, and the voltage wiring is disposed on a second side facing the first side of the gate driver.

The plurality of stages may have spaces between the plurality of stages. The clock signal wiring may have a main clock signal line extending in a first direction and a sub clock signal line extending in a second direction substantially perpendicular to the first direction. The voltage wiring may have a main voltage line extending in a first direction and a sub voltage line extending in a second direction. The sub clock signal line and the sub voltage line may be disposed on the different space.

The voltage wiring may include a first voltage wiring and a second voltage wiring which transfer different voltages to the gate driver, the first voltage wiring including a first main voltage line extending in the first direction and a first sub voltage line extending in the second direction, the second voltage wiring including a second main voltage line extending in a first direction and a second sub voltage line extending in a second direction.

The first main voltage line, the second main voltage line and the first sub voltage line may be formed of a same material in a same plane, and the second sub voltage line may be formed of a different material from the first main voltage line, the second main voltage line and the first sub voltage line.

The second sub voltage line is connected to the second main voltage line via a contact assistance connecting the second main voltage line and the second sub voltage line via a first contact hole and a second contact hole that expose the second main voltage line and the second sub voltage line, respectively.

The voltage wiring may be disposed between the gate driver and the plurality of pixels in a plan view.

The plurality of gate lines may cross the first main voltage line and the second main voltage line.

According to the exemplary embodiment of the inventive concept, it is possible to prevent a parasitic capacitor from being generated by reducing overlapping between signal transferring wirings transferring a driving control signal to a gate driver and reduce a load of the signal transferring wirings. As a result, it is possible to reduce power consumption of the gate driver and reduce heat generation.

Particularly, it is possible to reduce power consumption of the gate driver by reducing a load of a clock signal wiring transferring a clock signal to the gate driver.

DETAILED DESCRIPTION OF THE EMBODIMENTS

Figure 1:
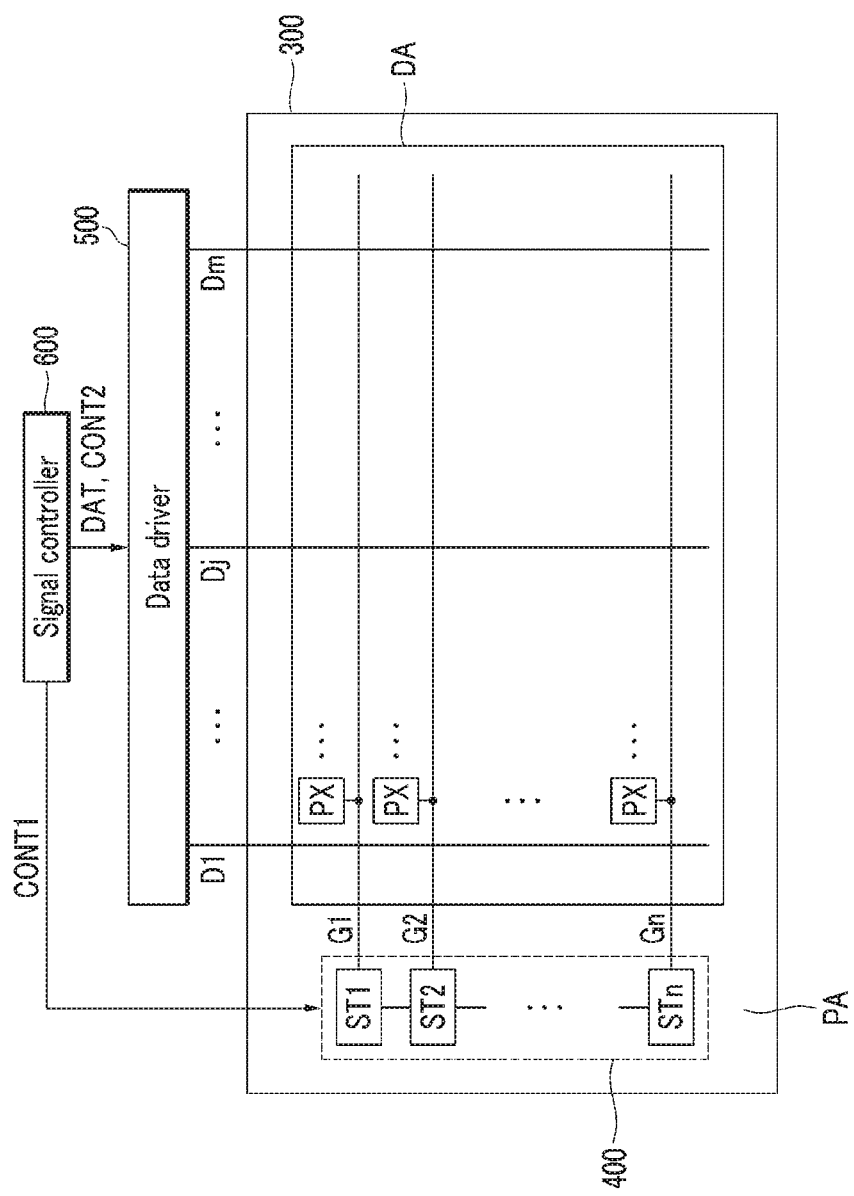
FIG. 1 is a block diagram of a display device according to an exemplary embodiment of the inventive concept.

The inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the inventive concept.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be formed directly on the other element or formed with intervening elements. In contrast, when an element is referred to as being "directly on" another element, there are no intervening elements present.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

First, a display device according to an exemplary embodiment of the inventive concept will be described with reference to FIGS. 1 to 3.

Figure 2:
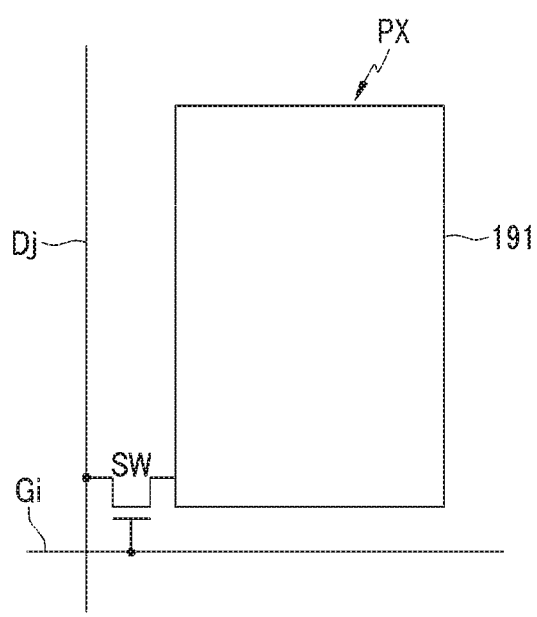
FIG. 2 is a schematic circuit diagram of one pixel of the display device according to the exemplary embodiment of the inventive concept.
Figure 3:
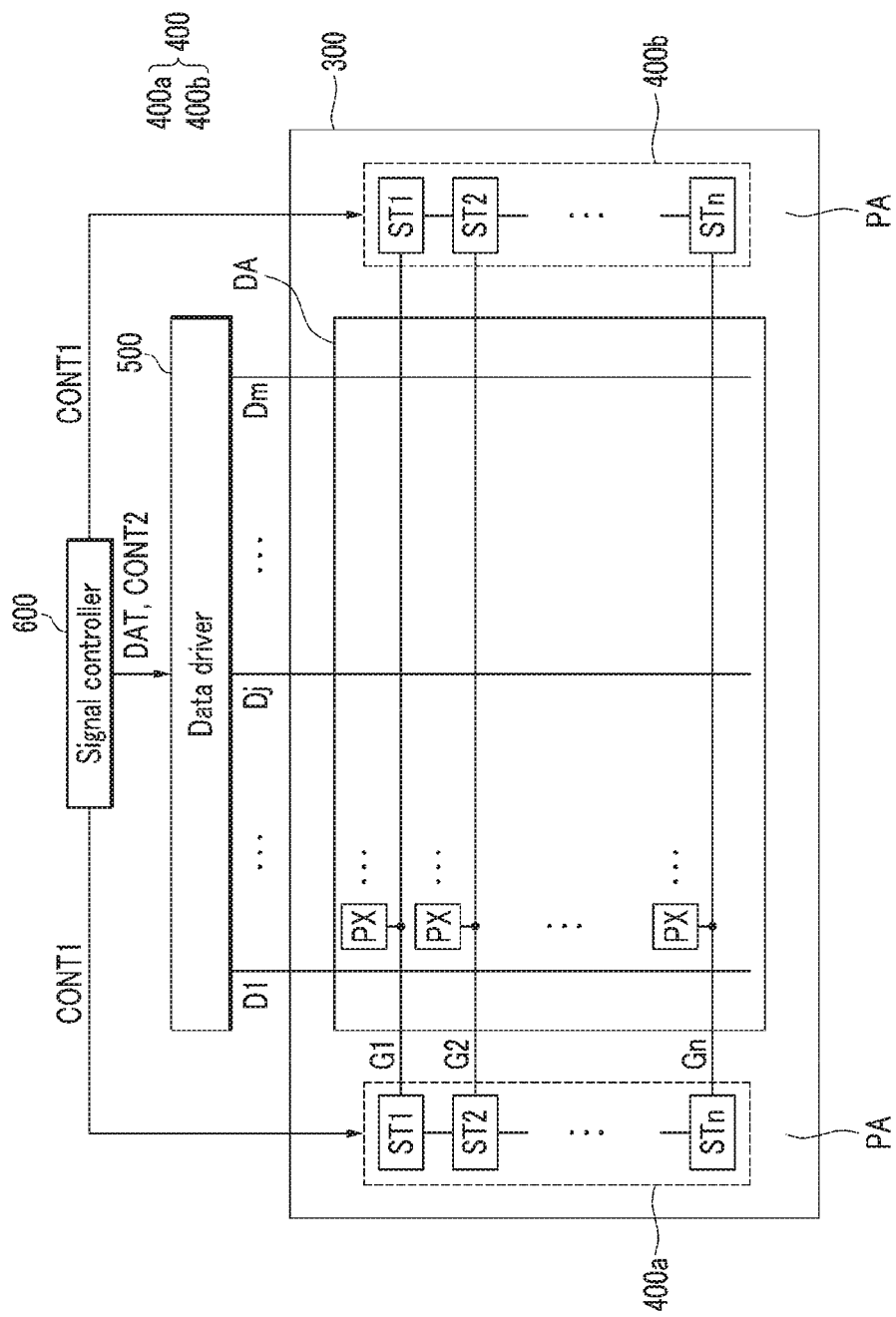
FIG. 3 is a block diagram of a display device according to an exemplary embodiment of the inventive concept.

FIG. 1 is a block diagram of a display device according to an exemplary embodiment of the inventive concept, FIG. 2 is a schematic circuit diagram of one pixel of the display device according to the exemplary embodiment of the inventive concept, and FIG. 3 is a block diagram of a display device according to an exemplary embodiment of the inventive concept.

Referring to FIG. 1, a display device according to an exemplary embodiment of the inventive concept includes a display panel 300, a gate driver 400, a data driver 500, and a signal controller 600.

The display panel 300 may be display panels included in various display devices such as a liquid crystal display (LCD), an organic light emitting display (OLED), and an electrowetting display (EWD).

The display panel 300 includes a display area DA displaying an image, and a peripheral area PA surrounding the display area DA.

In the display area DA, a plurality of gate lines G1-Gn, a plurality of data lines D1-Dm, and a plurality of pixels PX connected to the plurality of gate lines G1-Gn and the plurality of data lines D1-Dm are disposed.

The gate lines G1-Gn may transfer gate signals, extend substantially in a row direction, and be substantially parallel to each other.

The data lines D1-Dm may transfer data voltages corresponding to the image signals, extend substantially in a column direction, and be substantially parallel to each other.

The plurality of pixels PX may be arranged substantially in a matrix form.

Referring to FIG. 2, each pixel PX may include at least one switching element SW connected to a gate line Gi and a data line Dj, and at least one pixel electrode 191 connected to the gate line Gi and the data line Dj. The switching element SW may be a three-terminal element such as a thin film transistor integrated on the display panel 300. The thin film transistor includes a gate terminal, an input terminal, and an output terminal. The switching element SW may be turned on or off according to a gate signal of the gate line Gi to selectively transfer a data signal from the data line Dj to the pixel electrode 191. The switching element SW may include at least one thin film transistor. The pixel PX may display a corresponding image according to the data voltage applied to the pixel electrode 191.

The peripheral area PA may be covered by the light blocking member. The peripheral area PA may surround the display area DA or be positioned at an edge of the display panel 300.

In the peripheral area PA, the gate driver 400 and a plurality of signal transferring wirings (not illustrated) transferring driving control signals to the gate driver 400 may be positioned. In the peripheral area PA, the gate lines G1-Gn and the data lines D1-Dm of the display area DA may be extended.

The signal controller 600 controls the drivers such as the data driver 500 and the gate driver 400.

The signal controller 600 receives input image signals and an input control signal controlling the display of the input image signals from an external graphic controller (not illustrated). An example of the input control signal includes a vertical synchronization signal Vsync, a horizontal synchronization signal Hsync, a main clock MCLK, a data enable signal DE, and the like. The signal controller 600 convert the input image signal to a digital image signal DAT using the input image signal and the input control signal, and generates a gate control signal CONT1, a data control signal CONT2, and the like. The gate control signal CONT1 includes a scanning start signal STV instructing scanning start, at least one clock signal controlling an output period of a gate-on voltage Von, at least one off voltage, and the like. The data control signal CONT2 includes a horizontal synchronization start signal informing transmission start of the digital image signal DAT for pixels PX in one row, a load signal, a data clock signal, and the like.

The signal controller 600 may be mounted on a printed circuit board (PCB), and may transfer the data control signal CONT2, the gate control signal CONT1, the digital image signal DAT, and the like to the gate driver 400 and the data driver 500 through a film (not illustrated) such as a flexible printed circuit film.

The data driver 500 is connected to the data lines D1-Dm of the display panel 300. The data driver 500 receives the data control signal CONT2 and the digital image signal DAT from the signal controller 600 and selects a gray voltage corresponding to each digital image signal DAT to convert the digital image signal DAT into an analog data signal, and then apply the converted analog data signal to the corresponding data lines D1-Dm.

The data driver 500 may be mounted on the peripheral area PA of the display panel 300 as a plurality of driving IC chips, or mounted on a flexible printed circuit film or a printed circuit board (PCB) connected to the display panel 300. According to another exemplary embodiment of the inventive concept, the data driver 500 may be integrated in the peripheral area PA of the display panel 300 by the same process together with an electric element such as a thin film transistor of the display area DA.

The gate driver 400 is connected to the gate lines G1-Gn. The gate driver 400 generates a gate signal having a gate-on voltage Von and a gate-off voltage Voff according to the gate control signal CONT1 from the signal controller 600, and applies the gate signals to the gate lines G1-Gn. The gate-on voltage Von is a voltage which is applied to the gate terminal of the thin film transistor in the display area DA to turn on the thin film transistor, and the gate-off voltage Voff is a voltage which is applied to the gate terminal of the thin film transistor to turn off the thin film transistor.

Referring to FIG. 1, the gate driver 400 according to the exemplary embodiment of the inventive concept includes a plurality of stages ST1-STn which are serially connected to each other and arranged in sequence. The output of each stage is connected to a data input of the next stage in a chain.

The plurality of stages ST1-STn generates gate signals to sequentially transfer the gate signals to the respective gate lines G1-Gn. Each of the stages ST1-STn includes a gate driving circuit connected to each of the gate lines G1-Gn, and may have a gate output terminal (not illustrated) outputting a gate signal.

The stages ST1-STn of the gate driver 400 may be positioned in the peripheral area PA at the left or the right of the display area DA, and arranged in a column direction in a line. In FIG. 1, an example in which the plurality of stages ST1-STn is positioned in the peripheral area PA positioned at the left of the display area DA is illustrated, but the positions of the plurality of stages ST1-STn are not limited thereto, and the plurality of stages ST1-STn may be positioned at least one position of the peripheral areas PA at the right, the upper side, or the lower side of the display area DA.

According to an exemplary embodiment of the inventive concept, each of the stages ST1-STn may be connected to output terminals of previous stages ST1-STn or subsequent stages ST1-STn. A first stage ST1 without having the previous stage may receive a scanning start signal STV notifying a start of one frame. The last stage STn without having the subsequent stage may not be connected to the output terminal of the subsequent stage, but receive another signal, for example, a reset signal or another scanning start signal.

Each of the stages ST1-STn may include an active element such as a plurality of thin film transistors and a passive element such as a capacitor which are integrated in the peripheral area PA of the display panel 300. The active element and the passive element included in the gate driver 400 may be manufactured by the same process as the thin film transistor and the like included in the pixel PX of the display area DA.

The driving control signals such as the off voltage and the clock signal required for driving the plurality of gate drivers 400 including the gate control signal CONT1 may be input to the gate driver 400 through the plurality of signal transferring wirings formed at a portion adjacent to the gate driver 400. The plurality of signal transferring wirings may be positioned in the peripheral area PA of the display panel 300 where the gate driver 400 is positioned and extended in a column direction.

Referring to FIG. 3, the display device according to the exemplary embodiment of the inventive concept is almost the same as the display device illustrated in FIGS. 1 and 2 described above, but the gate driver 400 may include a first gate driver 400a and a second gate driver 400b which are positioned in left and right peripheral areas PA of the display device 300, respectively.

Although not illustrated, the first gate driver 400a and the second gate driver 400b may receive driving control signals such as the gate control signal CONT1 through different signal transferring wirings.

Each of the first gate driver 400a and the second gate driver 400b may have substantially the same structure and feature as the gate driver 400 illustrated in FIG. 1 described above.

Each of the first gate driver 400a and the second gate driver 400b includes the plurality of stages ST1-STn arranged in a column direction in a line. The corresponding stages of the first gate driver 400a and the second gate driver 400b may be connected to the same gate line G1-Gn to apply a gate signal as illustrated in FIG. 3.

According to another exemplary embodiment of the inventive concept, the first gate driver 400a and the second gate driver 400b may be connected to the different gate lines G1-Gn to apply the gate signal. For example, the first gate driver 400a may be connected to odd numbered gate lines G1, G3 . . . and the second gate driver 400b may be connected to even numbered gate lines G2, G4, . . . . On the contrary, the first gate driver 400a may be connected to even numbered gate lines G2, G4, . . . and the second gate driver 400b may be connected to odd numbered gate G1, G3, . . . , lines.

Next, a detailed structure of the gate driver according to the exemplary embodiment of the inventive concept will be described with reference to FIG. 4.

Figure 4:
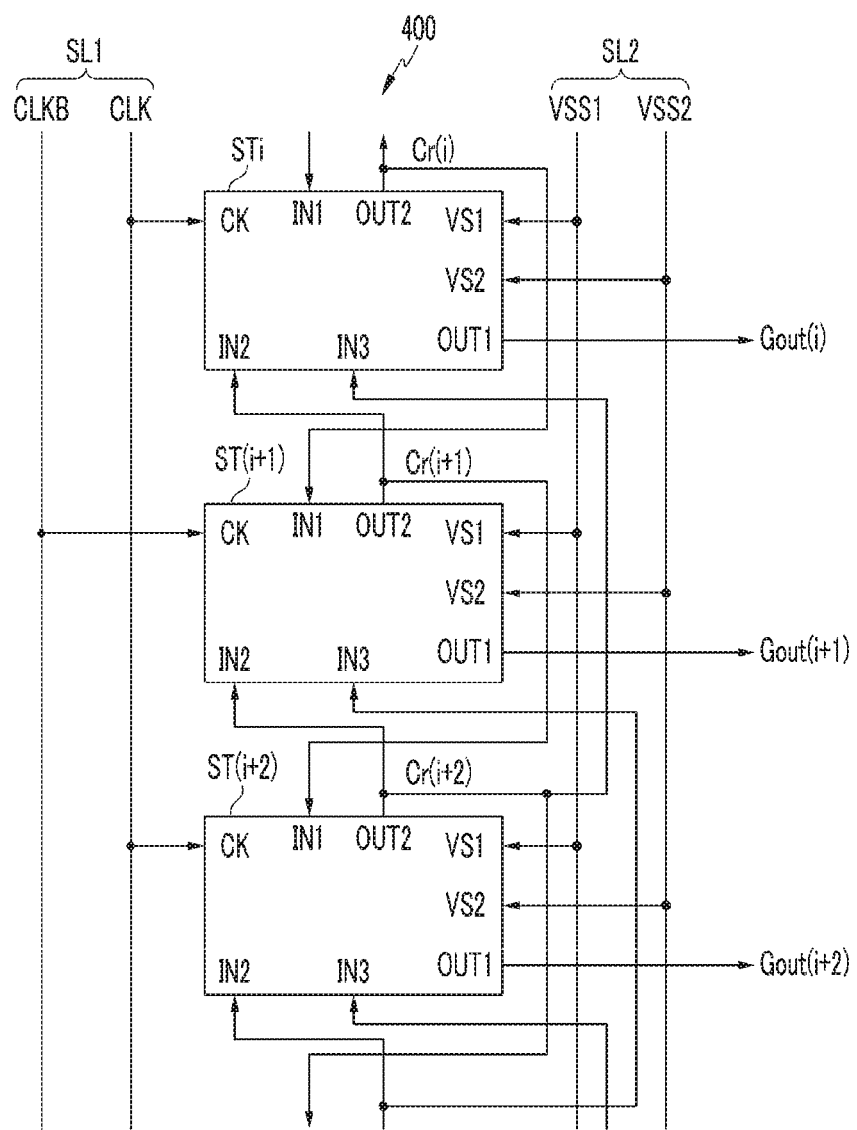
FIG. 4 is a block diagram of a gate driver according to the exemplary embodiment of the inventive concept.

FIG. 4 is a block diagram of a gate driver according to the exemplary embodiment of the inventive concept.

Referring to FIGS. 1, 3, and 4, the gate drivers 400, 400a, and 400b according to the exemplary embodiment of the inventive concept include a plurality of stages ST1, . . . , STi, ST(i+1), ST(i+2), . . . which is serially connected to each other and sequentially outputs gate signals Gout 1, . . . , Gout(i), Gout i+1, Gout i+2, . . . , Gout(n), and a plurality of signal transferring wirings transferring various driving control signals CLK, CLKB, VSS1, VSS2, and STV inputted to the stages ST1, . . . , STi, ST(i+1), ST (i+2), . . . . Here, the signal transferring wirings will be named according to the driving control signals CLK, CLKB, VSS1, and VSS2 transferred by the signal transferring wiring, respectively.

The plurality of signal transferring wirings may include, for example, clock signal wirings transferring a clock signals including a clock signal CLK and a clock signal bar CLKB, a voltage wiring including first and second voltage wirings VSS1 and VSS2 transferring the first off voltage VSS1 (firs off voltage) and the second off voltage VSS2 (second off voltage), a scanning start signal wiring (not illustrated) transferring the scanning start signal STV, and the like. Phases of the clock signal CLK and the clock signal bar CLKB may be opposite to each other.

According to the exemplary embodiment of the inventive concept, the plurality of signal transferring wirings is separated into a first signal transferring wiring disposed on the first signal transferring wiring region SL1 and a second signal transferring wiring disposed on the second signal transferring wiring region SL2. The first signal transferring wiring region SL1 and the second signal transferring wiring region SL2 are positioned at both sides of the plurality of stages ST1, . . . , STi, ST(i+1), ST(i+2), . . . arranged in a column direction. For example, the clock signal wirings transferring the clock signals CLK and CLKB may be positioned in the first signal transferring wiring region SL1, and the first and second voltage wirings VSS1 and VSS2 may be positioned in the second signal transferring wiring region SL2.

Particularly, according to the exemplary embodiment of the inventive concept, the first and second voltage wirings VSS1 and VSS2 are positioned in the signal transferring wiring region SL2 which are opposite to the signal transferring wiring region SL1 in which the clock signal wirings transferring the clock signals CLK and CLKB are positioned. Thus the first and second voltage wiring VSS1 and VSS2 do not to cross or overlap with the clock signal wirings transferring the clock signals CLK and CLKB.

Each of the stages ST1, . . . , STi, ST(i+1), ST(i+2), . . . may include a clock terminal CK, a first off voltage input terminal VS1, a second off voltage input terminal VS2, a first output terminal OUT1, a second output terminal OUT2, a first input terminal IN1, a second input terminal IN2, and a third input terminal IN3.

One of the clock signal CLK and the clock signal bar CLKB may be input to the clock terminal CK of each of the stages ST1, . . . , STi, ST(i+1), ST(i+2), . . . . For example, the clock signals CLK may be applied to the clock terminals CK of the odd numbered stages ST1, ST3 . . . , and the clock signals bar CLKB may be applied to the clock terminals CK of the even numbered stages ST2, ST4 . . . . On the contrary, the clock signals CLK may be applied to the clock terminals CK of the even numbered stages ST2, ST4 . . . , and the clock signals bar CLKB may be applied to the clock terminals CK of the odd numbered stages ST1, ST3 . . . .

The first off voltage VSS1 and the second off voltage VSS2 which are off voltages having different voltage levels are input to the first off voltage input terminal VS1 and the second off voltage input terminal VS2, respectively. According to an exemplary embodiment of the inventive concept, the second off voltage VSS2 may be lower than the first off voltage VSS1. Values of the first off voltage VSS1 and the second off voltage VSS2 may vary according to the pixel used, and be approximately −5 V or less. The first off voltage VSS1 may be, for example, approximately −5.6 V, and the second off voltage VSS2 may be, for example, approximately −9.2 V.

The first output terminal OUT1 is a gate output terminal outputting the gate signals Gout1, . . . , Gout(i), Gout(i+1), Gout(i+2), . . . generated by the stages ST1, . . . , STi, ST(i+1), ST(i+2), . . . , respectively. The second output terminal OUT2 is a carry output terminal outputting carry signals Cr1, . . . , Cr(i), Cr(i+1), Cr(i+2), . . . generated by the stages ST1, . . . , STi, ST(i+1), ST(i+2), . . . , respectively.

The first input terminal IN1 may receive carry signals Cr1, . . . , Cr(i), Cr(i+1), Cr(i+2), . . . of the previous stage. In the case of the first stage ST1 which has no previous stage, the scanning start signal STV may be input to the first input terminal IN1.

The carry signals Cr1, . . . , Cr(i), Cr(i+1), Cr(i+2), . . . of the subsequent stage, particularly, the carry signals Cr1, . . . , Cr(i), Cr(i+1), Cr(i+2), . . . of the next stage may be input to the second input terminal IN2.

The carry signals Cr1, . . . , Cr(i), Cr(i+1), Cr(i+2), . . . of the subsequent stage, particularly, the carry signals Cr1, . . . , Cr(i), Cr(i+1), Cr(i+2), . . . of the stages after next stages may be input to the third input terminal IN3.

Next, a detailed structure of each stage of the gate driver illustrated in FIG. 4 described above will be described with reference to FIG. 5.

Figure 5:
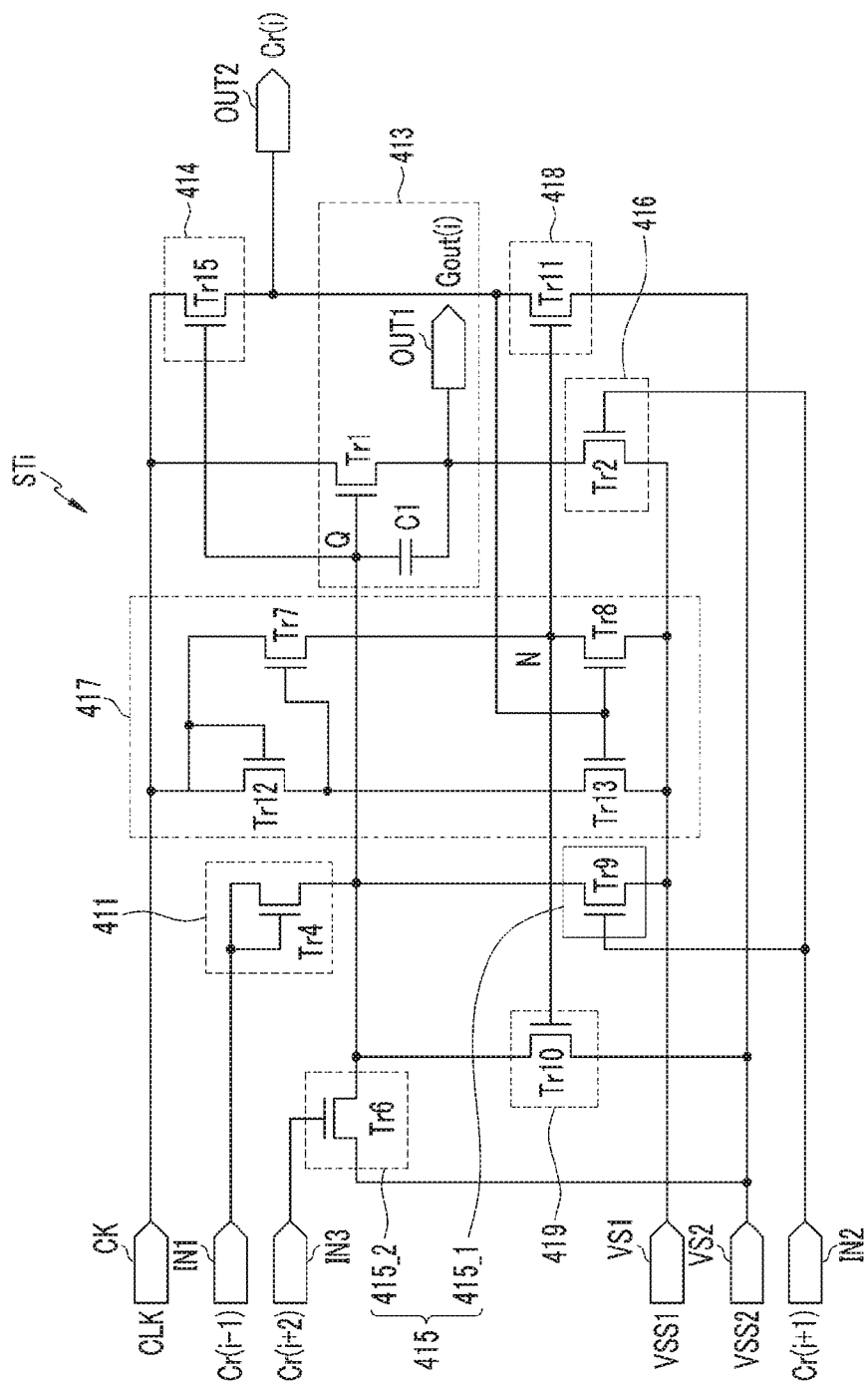
FIG. 5 is an example of a circuit diagram of one stage of the gate driver according to the exemplary embodiment of the inventive concept.

FIG. 5 illustrates an example of the circuit diagram of one stage, for example, an i-th stage STi of the gate driver according to the exemplary embodiment of the inventive concept.

The stage STi according to the exemplary embodiment of the inventive concept includes a plurality of transistors Tr1, Tr2, Tr4, Tr6, Tr7, Tr8, Tr9, Tr10, Tr11, Tr12, Tr13, and Tr15 and at least one capacitor C1 in addition to the clock terminal CK, the first off voltage input terminal VS1, the second off voltage input terminal VS2, the first output terminal OUT1, the second output terminal OUT2, the first input terminal IN1, the second input terminal IN2, and the third input terminal IN3, as described above. FIG. 5 illustrates 12 transistors, but the number of transistors is not limited thereto.

The plurality of transistors and capacitor included in the stage STi may be classified into a buffer portion 411, a pull-up portion 413, a carry portion 414, a discharge portion 415, a pull-down portion 416, a switching portion 417, a first storage portion 418, and a second storage portion 419, according to a function.

The buffer portion 411 transfers a carry signal of the previous stages or a scanning start signal STV to the pull-up portion 413. The buffer portion 411 may receive, for example, a carry signal Cr(i−1) of the previous stage ST(i−1). In the exemplary embodiment, it is described that the buffer portion 411 transfers the carry signal Cr(i−1) of the previous stage ST(i−1), but is not limited thereto.

The buffer portion 411 may include a fourth transistor Tr4. An input terminal and a control terminal of the fourth transistor Tr4 are connected to the first input terminal IN1, and an output terminal is connected to a node Q. Thus, the fourth transistor Tr4 may act like a diode with characteristics similar to a pn-junction diode. When the carry signal Cr(i−1) input to the first input terminal IN1 is at a high level, the fourth transistor Tr4 becomes forward bias and a large current flows through the fourth transistor Tr4. As a result, the output voltage becomes a high level voltage. On the contrary, when the carry signal Cr(i−1) is at a low level, the fourth transistor Tr4 becomes reverse biased and no current flows through the fourth transistor Tr4.

The pull-up portion 413 is connected to the clock terminal CK, the node Q, and the first output terminal OUT1, and outputs a gate signal Gout(i) through the first output terminal OUT1.

The pull-up portion 413 may include, for example, a first transistor Tr1 and a capacitor C1. The control terminal of the first transistor Tr1 is connected to the node Q, the input terminal is connected to the clock terminal CK, and the output terminal is connected to the first output terminal OUT1. The capacitor C1 is connected between the control terminal and the output terminal of the first transistor Tr1. The capacitor C1 is charged in response to the carry signal Cr(i−1) provided by the buffer portion 411. When the clock signals CLK and CLKB from the clock terminal CK are at the high voltages while the voltage of the node Q is at the high level according to the charge of the capacitor C1, the first transistor Tr1 is bootstrapped. In this case, the node Q is boosted from the charging voltage of the capacitor C1 to a boosting voltage. When the boosting voltage is applied to the control terminal of the first transistor Tr1, the first transistor Tr1 outputs the high voltages of the clock signals CLK and CLKB as a gate-on voltage Von through the first output terminal OUT1. When the voltage of the node Q drops to the low level, the first transistor Tr1 is turned off, and the off voltage may be output to the first output terminal OUT1.

The pull-down portion 416 pulls-down the voltage of the gate signal Gout(i) output to the first output terminal OUT1 to the first off voltage VSS1 applied to the first off voltage input terminal VS1 when the carry signal of one of the subsequent stages Cr(i+1) is supplied from the second input terminal IN2. For example, a carry signal Cr(i+1) of the next stage ST(i+1) may be received in the second input terminal IN2. In the exemplary embodiment, it is described that the pull-down portion 416 receives the carry signal Cr(i+1) of the next stage ST(i+1), but is not limited thereto.

The pull-down portion 416 may include a second transistor Tr2. A control terminal of the second transistor Tr2 is connected to the second input terminal IN2, an input terminal is connected to the first off voltage input terminal VS1, and an output terminal is connected to the first output terminal OUT1.

The carry portion 414 is connected to the clock terminal CK, the node Q, and the second output terminal OUT2, and outputs a carry signal Cr(i) through the second output terminal OUT2. The carry portion 414 outputs the high voltage of the clock signals CLK and CLKB received in the clock terminal CK as the carry signal Cr(i) when the high voltage is applied to the node Q.

The carry portion 414 may include a fifteenth transistor Tr15. The clock terminal CK is connected to an input terminal of the fifteenth transistor Tr15, a control terminal is connected to the node Q, and an output terminal is connected to the second output terminal OUT2.

The first storage portion 418 maintains the output of the second output terminal OUT2 at the second off voltage VSS2 in response to the signal of the node N except when the second output terminal outputs the high voltage of the carry signal Cr(i).

The first storage portion 418 may include an eleventh transistor Tr11. A control terminal of the eleventh transistor Tr11 is connected to the node N, an input terminal is connected to the second off voltage input terminal VS2, and an output terminal is connected to the second output terminal OUT2. The eleventh transistor Tr11 maintain the voltage of the carry signal Cr(i) at the second off voltage VSS2 when the voltage of the node N is at a high level.

The switching portion 417 applies a signal having the same phase as the clock signals CLK and CLKB received in the clock terminal CK to the node N for a period other than the output period of the high voltage of the carry signal Cr(i).

The switching portion 417 may include a twelfth transistor Tr12, a seventh transistor Tr7, and a thirteenth transistor Tr13, and an eighth transistor Tr8.

The discharge portion 415 discharges the high voltage of the node Q to the second off voltage VSS2 having a lower level than the first off voltage VSS1 in response to the carry signal of at least one of the subsequent stages.

The discharge portion 415 may include a first discharge portion 415_1 including a ninth transistor Tr9, and a second discharge portion 415_2 including a sixth transistor Tr6.

The first discharge portion 415_1 discharges the voltage of the node Q to the first off voltage VSS1 applied to the first off voltage input terminal VS1 when the carry signal Cr(i+1) is received from the second input terminal IN2.

The second discharge portion 415_2 discharges the voltage of the node Q to the second off voltage VSS2 applied to the second off voltage input terminal VS2 when the carry signal is applied to the third input terminal IN3. For example, the carry signal Cr(i+2) of the stage ST(i+2) the stage after next stage may be received in the third input terminal IN3.

The second storage portion 419 maintains the voltage of the node Q at the second off voltage VSS2 in response to the signal of the node N for the remaining period of the frame. The second storage portion 419 may include a tenth transistor Tr10.

The structure of one stage STi of the gate driver 400 illustrated in FIG. 5 is an example, but is not limited thereto.

Next, a structure of a gate driver and signal transferring wirings of a display device according to an exemplary embodiment of the inventive concept will be described with reference to FIGS. 6 to 12 together with the drawings described above.

Figure 6:
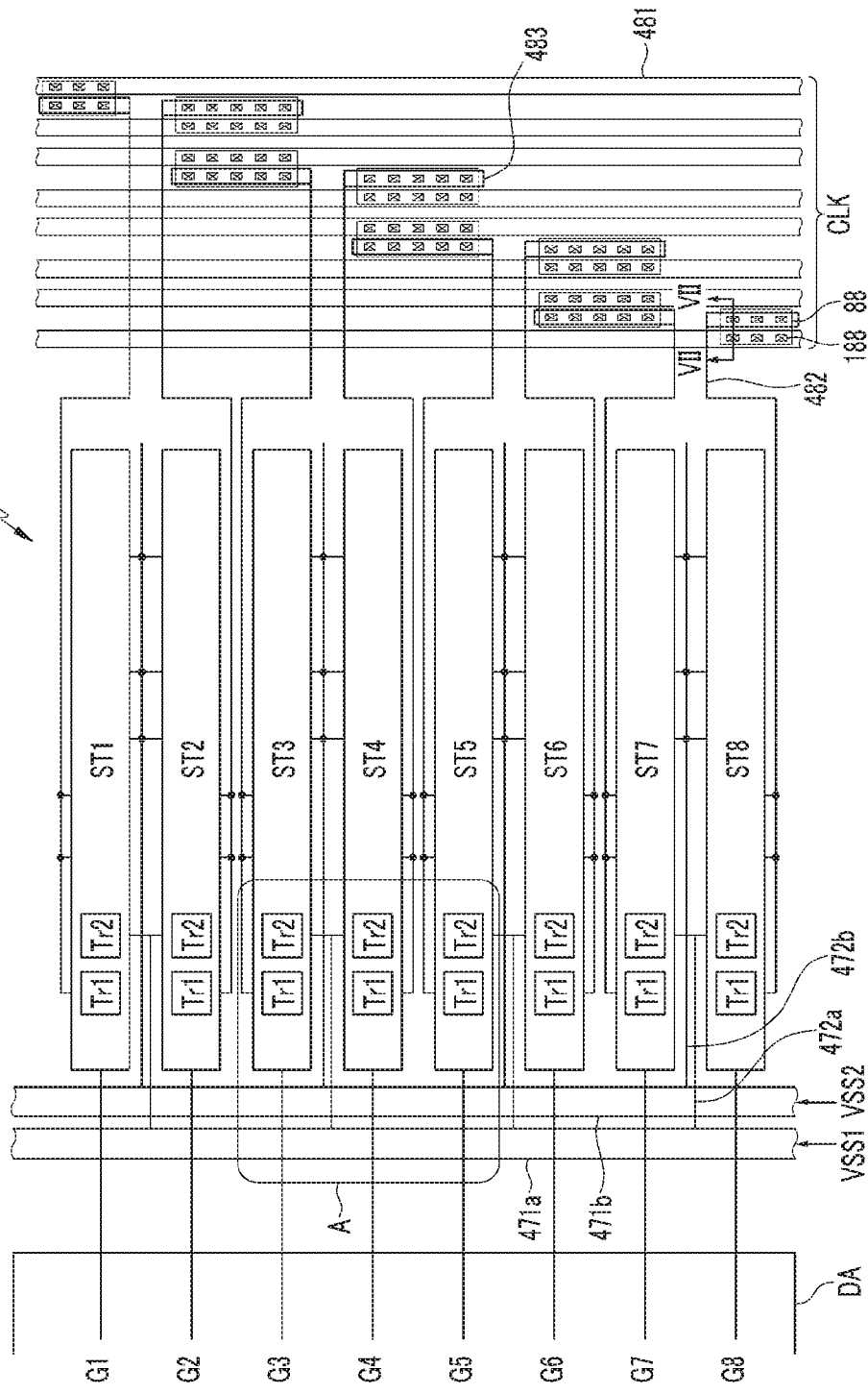
FIG. 6 is a layout view of a gate driver and a signal transferring wiring according to the exemplary embodiment of the inventive concept.
Figure 7:
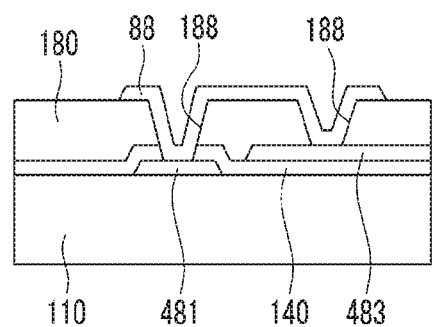
FIG. 7 is a cross-sectional view illustrating the gate driver and the signal transferring wiring illustrated in FIG. 6 taken along line VII-VII.
Figure 8:
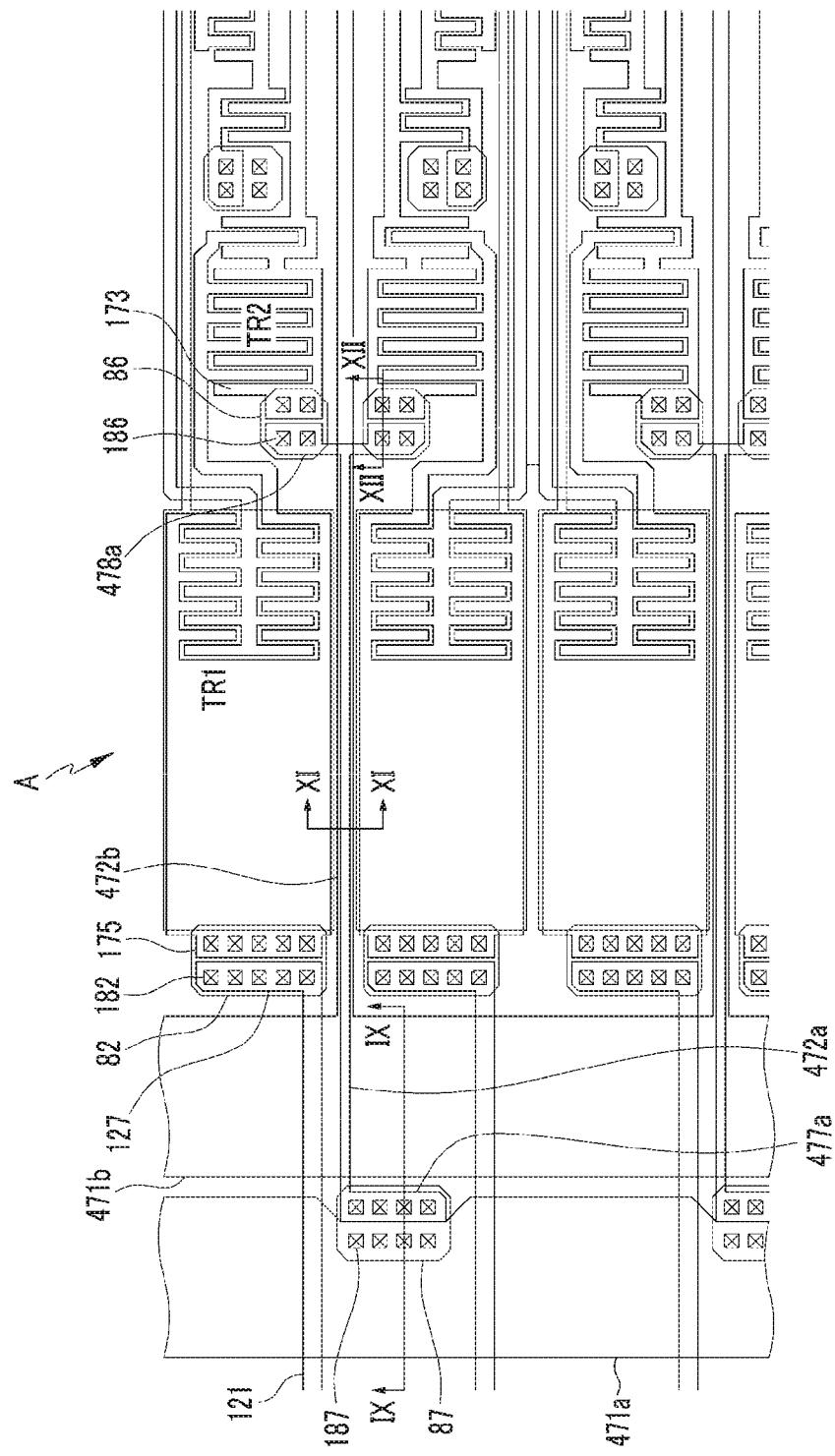
FIG. 8 is a diagram enlarging a part of the gate driver and the signal transferring wiring illustrated in FIG. 6.
Figure 9:
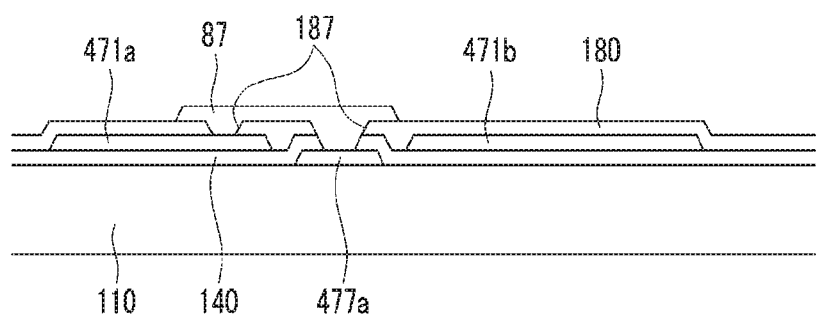
FIG. 9 is a cross-sectional view illustrating the gate driver and the signal transferring wiring illustrated in FIG. 8 taken along line IX-IX.
Figure 10:
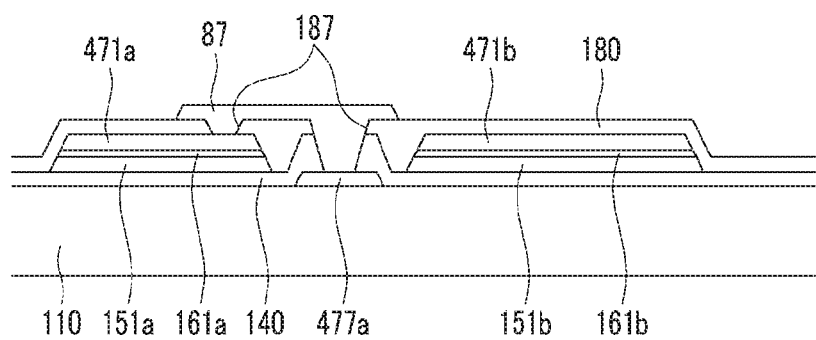
FIG. 10 is another cross-sectional view illustrating the gate driver and the signal transferring wiring illustrated in FIG. 8 taken along line IX-IX.
Figure 11:
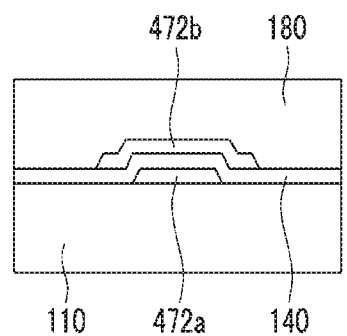
FIG. 11 is a cross-sectional view of the gate driver and the signal transferring wiring illustrated in FIG. 8 taken along line XI-XI.
Figure 12:
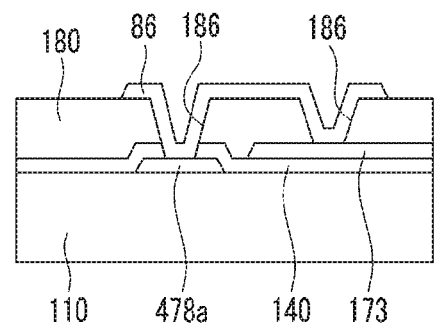
FIG. 12 is a cross-sectional view of the gate driver and the signal transferring wiring illustrated in FIG. 8 taken along line XII-XII.

FIG. 6 is a layout view of a gate driver and signal transferring wirings according to an exemplary embodiment of the inventive concept, FIG. 7 is a cross-sectional view illustrating the gate driver and the signal transferring wiring illustrated in FIG. 6 taken along line VII-VII, FIG. 8 is a diagram enlarging a part of the gate driver and the signal transferring wiring illustrated in FIG. 6, FIG. 9 is a cross-sectional view illustrating the gate driver and the signal transferring wiring illustrated in FIG. 8 taken along line IX-IX, FIG. 10 is another cross-sectional view illustrating the gate driver and the signal transferring wiring illustrated in FIG. 8 taken along line IX-IX, FIG. 11 is a cross-sectional view of the gate driver and the signal transferring wiring illustrated in FIG. 8 taken along line XI-XI, and FIG. 12 is a cross-sectional view of the gate driver and the signal transferring wiring illustrated in FIG. 8 taken along line XII-XII.

First, referring to FIG. 6, a plurality of stages ST1, ST2, . . . included in the gate drivers 400, 400a, and 400b is sequentially arranged in a column direction. A gate output terminal of each of the stages ST1, ST2, . . . is connected to the gate lines G1, G2, . . . of the display area DA to output a gate signal.

A clock signal wiring transferring the clock signals CLK and CLKB is positioned at one side of the plurality of stages ST1, ST2 . . . . The clock signal wiring includes a main clock signal line 481 substantially extending in a column direction and a sub clock signal line 482 connected thereto.

The sub clock signal line 482 may include a portion extending substantially in a direction different from the main clock signal line 481, and for example, may include a portion extending substantially in a row direction. An end portion of the sub clock signal line 482 has an extension 483.

The main clock signal line 481 may include a plurality of signal lines extending in parallel with each other.

Each of the stages ST1, ST2, . . . may receive the clock signals CLK and CLKB from the main clock signal line 481 through the sub clock signal line 482. Referring to FIG. 6, each sub clock signal line 482 extends between the adjacent stages ST1, ST2, . . . to be connected to the clock terminal CK of each of the stages ST1, ST2, . . . .

Referring to FIG. 7, the main clock signal line 481 and the sub clock signal line 482 may be formed of different layers. For example, the main clock signal line 481 may be formed of a gate conductive layer and be disposed on the substrate 110. A gate insulating layer 140 may be disposed on the main clock signal line 481. The sub clock signal line 482 may be formed of a data conductive layer and be disposed on the gate insulating layer 140.

Here, the gate conductive layer includes a gate terminal of the thin film transistor included in the display area DA of the display panel 300 or the stages ST1, ST2, . . . of the gate driver 400 and gate lines G1, G2, . . . , and the like, and the data conductive layer may include an input terminal or an output terminal of the thin film transistor and data lines D1, D2, . . . .

The passivation layer 180 is disposed on the data conductive layer. The passivation layer 180 has contact holes exposing the main clock signal line 481 and the sub clock signal line 482, respectively.

A contact assistant 88 connecting the main clock signal line 481 and the sub clock signal line is disposed on the passivation layer 180.

The main clock signal line 481 and the sub clock signal line 482 may be electrically connected to each other by various methods. When the main clock signal line 481 and the sub clock signal line 482 are positioned at different layers from each other, the main clock signal line 481 and the sub clock signal line 482 may be electrically connected to each other through a contact assistant 88. Referring to FIG. 7, the contact assistant 88 may be positioned, for example, on a passivation layer 180. In this case, the gate insulating layer 140 and/or the passivation layer 180 may have a contact hole 188 exposing each of the main clock signal line 481 and an extension 483 of the sub clock signal line 482. The contact assistant 88 may electrically and physically contact the main clock signal line 481 and the extension 483 of the sub clock signal line 482 through the contact hole 188.

Referring back to FIG. 6, the first voltage wiring transferring the first off voltage VSS1 and the second voltage wiring transferring the second off voltage VSS2 are positioned at the other side of the plurality of stages ST1, ST2, . . . . That is, the plurality of stages ST1, ST2, . . . are disposed between the voltage wirings and the clock signal wirings. The first voltage wiring includes a main voltage line 471a extending substantially in a column direction and a sub voltage line 472a connected thereto. The second voltage wiring includes a main voltage line 471b extending substantially in a column direction and a sub voltage line 472b connected thereto.

The main voltage lines 471a and 471b may cross the gate lines G1, G2 . . . extending in a column direction.

The main voltage line 471a and the main voltage line 471b are disposed on the same side of the plurality of stages ST1, ST2, . . . and extend in parallel with each other.

According to the exemplary embodiment of the inventive concept, the main voltage line 471a and the main voltage line 471b may be positioned between the plurality of stages ST1, ST2, . . . and the display area DA. That is, the main voltage line 471a and the main voltage line 471b may be positioned at the gate output terminal side of the stages ST1, ST2, . . . . Particularly, the main voltage line 471a of the first voltage wiring transferring the first off voltage VSS1 may be positioned at the gate output terminal side of the stages ST1, ST2, . . . in order to optimize the layout, and the second voltage wiring is also positioned at the same side as the first voltage wiring of the stages ST1, ST2, . . . .

Accordingly, the first voltage wiring or the second voltage wiring is disposed on the opposite side of the clock signal wiring transferring the clock signals CLK and CLKB with respect to the stages ST1, ST2. Thus, the first voltage wiring or the second voltage wiring do not to cross or overlap another signal transferring wiring such as a clock signal wiring. Accordingly, the parasitic capacitor is not generated between the first voltage wiring or the second voltage wiring and other signal transferring wirings such as the clock signal wiring. Thus, a load of signal transferring wirings such as the clock signal wiring is decreased, thereby reducing power consumption and heat generation of the gate driver.

The sub voltage lines 472a and 472b may include a portion extending in a direction different from the main voltage lines 471a and 471b, and for example, may include a portion extending in a row direction.

Each of the stages ST1, ST2, . . . may receive the first off voltage VSS1 and the second off voltage VSS2 from the main voltage lines 471a and 471b through the sub voltage lines 472a and 472b. Referring to FIG. 6, each of the sub voltage lines 472a and 472b extends between the adjacent stages ST1, ST2, . . . to be connected to each of the first off voltage input terminal VS1 and second off voltage input terminal VS2 of each of the stages ST1, ST2, . . . .

The main voltage line 471a and the main voltage line 471b may be formed of the same layer. For example, both the main voltage line 471a and the main voltage line 471b may be formed of the data conductive layer.

The main voltage line 471a and the sub voltage line 472a of the first voltage wiring may be formed of different layers from each other, and the main voltage line 471b and the sub voltage line 472b of the second voltage wiring may be formed of the same layer and which is connected to each other. Accordingly, the sub voltage line 472a of the first voltage wiring and the sub voltage line 472b of the second voltage wiring may be positioned at different layers from each other, and may overlap with each other and extend in parallel as illustrated in FIG. 7.

Next, a structure of the first and second voltage wirings and the stages of the gate driver of the display device according to the exemplary embodiment of the inventive concept will be described in detail with reference to FIGS. 8 to 12 in addition to FIGS. 6 and 7.

Referring to FIGS. 8 to 12, a gate conductive layer including a plurality of gate lines 121, a plurality of sub voltage lines 472a of the first voltage wiring, and a gate terminal of a plurality of thin film transistors positioned in the display area DA or the plurality of thin film transistors included in the stages ST1, ST2, . . . is positioned on the substrate 110 including an insulating material such as glass and plastic.

Referring to FIG. 7, one end portion of the gate line 121 has an extension 127 to be connected to an output terminal of the first transistor Tr1.

The gate conductive layer may include the main clock signal line 481 of the clock signal wiring as described above.

The sub voltage line 472a of the first voltage wiring has an extension 477a to be connected to the main voltage line 471a. The main voltage line 471a facing the extension 477a of the sub voltage line 472a may form a concave shape by decreasing a width of the wiring.

The other end portion of the sub voltage line 472a of the first voltage wiring has an extension 478a to be connected to each of an input terminal 173 of the stages ST1, ST2 . . . .

The gate conductive layer may include at least one conductive material such as a metal.

A gate insulating layer 140 including an insulating material such as silicon nitride (SiNx) or silicon oxide (SiOx) is disposed on the gate conductive layer.

A data conductive layer including a plurality of data lines (not illustrated), the main voltage line 471a of the first voltage wiring, the main voltage line 471b and the sub voltage line 472b of the second voltage wiring, and an input terminal or an output terminal of the plurality of thin film transistors positioned in the display area DA or the plurality of thin film transistors included in the stages ST1, ST2, . . . is positioned on the gate insulating layer 140. For example, the data conductive layer may include an output terminal 175 of the first transistor Tr1 forming a gate output terminal of the stages ST1, ST2, . . . , and the input terminal 173 of the second transistor Tr2 forming the first off voltage input terminal VS1.

The sub voltage line 472a of the first voltage wiring and the sub voltage line 472b of the second voltage wiring may be formed of different layers from each other, and may extend to overlap with each other as illustrated in FIG. 8. The sub voltage line 472a of the first voltage wiring and the sub voltage line 472b of the second voltage wiring extend between the adjacent stages ST1, ST2, . . . to be connected to each of the stages ST1, ST2, . . . .

The data conductive layer may include the sub clock signal line 482 of the clock signal wiring as described above.

The data conductive layer may include at least one conductive material such as a metal.

Referring to FIGS. 8 to 12, semiconductors 151a and 151b may be further positioned between the data conductive layer and the gate insulating layer 140. The semiconductor 151a and 151b may include amorphous silicon, polysilicon, or an oxide semiconductor. The ohmic contacts 161a and 161b, which may be made of a material such as n+ hydrogenated amorphous silicon in which an n-type impurity such as phosphorus is doped at a high concentration or silicide, may be further disposed between the semiconductor 151a and 151b and the data conductive layer.

A passivation layer 180 including an organic insulating material or an inorganic insulating material is disposed on the data conductive layer.

The gate insulating layer 140 and/or the passivation layer 180 includes a contact hole 187 exposing each of the main voltage line 471a of the first voltage wiring and the extension 477a of the sub voltage line 472a, and a contact hole 186 exposing each of the extension 478a of the sub voltage line 472a of the first voltage wiring and the input terminal 173 of the second transistor Tr2 adjacent thereto. Further, the gate insulating layer 140 and/or the passivation layer 180 may include a contact hole 182 exposing each of an extension 127 of the gate line 121 and the output terminal 175 of the first transistor Tr1.

A pixel electrode layer including a plurality of contact assistants 87, 86, and 82 is positioned on the passivation layer 180. The pixel electrode layer may include a plurality of pixel electrodes (not illustrated) of the display area DA.

The contact assistant 87 electrically connects the main voltage line 471 of the first voltage wiring and the extension 477a of the sub voltage line 472a with each other through the contact hole 187. The contact assistant 86 electrically connects the extension 478a of the sub voltage line 472a of the first voltage wiring and the input terminal 173 of the second transistor Tr2 of the stages ST1, ST2, . . . with each other through the contact hole 186. The contact assistant 82 electrically connects the extension 127 of the gate line 121 and the output terminal 175 of the first transistor Tr1 with each other through the contact hole 182.

The pixel electrode layer may include a transparent conductive material such as ITO and IZO or a conductive material such as metal.

In the exemplary embodiment of the inventive concept, an example in which the main voltage line 471a of the first voltage wiring is positioned between the main voltage line 471b of the second voltage wiring and the display area DA is mainly described, but is not limited thereto. That is, positions of the first voltage wiring and the second voltage wiring may be changed.

In this case, on the contrary to the exemplary embodiment described above, the main voltage line 471b and the sub voltage line 472b of the second voltage wiring may be formed of different layers from each other and connected to each other through the contact assistant, and the main voltage line 471a and the sub voltage line 472a of the first voltage wiring may be formed of the same layer which is connected to each other. Further, when the sub voltage line 472b of the second voltage wiring may be connected to the input terminal of the corresponding thin film transistor of the stages ST1, ST2, . . . through a separate contact hole (not illustrated) and a contact assistant (not illustrated).

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device, comprising:
a plurality of pixels;
a plurality of gate lines connected to the plurality of pixels;
a gate driver including a plurality of stages outputting gate signals to the plurality of gate lines;
a plurality of clock signal wirings transferring clock signals to the gate driver; and
a first voltage wiring transferring a first voltage to the gate driver;
wherein:
the clock signal wirings are disposed at a first side of the gate driver, and
the first voltage wiring is disposed at a second side facing the first side of the gate driver, and
wherein:
the plurality of stages comprises a first stage, a second stage, a third stage, and a fourth stage which are sequentially arranged adjacently,
the first voltage wiring has a first main voltage line extending in a first direction and a first sub voltage line extending in a second direction different from the first direction,
the first sub voltage line is disposed between the first stage and the second stage or between the third stage and the fourth stage,
each of the clock signal wirings has a main clock signal line extending in a third direction and a sub clock signal line extending in a fourth direction different from the third direction, and a first sub clock signal line of a first clock signal wiring is disposed between the second stage and the third stage.

2. The display device of claim 1, further comprising a second voltage wiring transferring a second voltage different from the first voltage to the gate driver,
wherein both the first voltage and the second voltage are negative voltages.

3. The display device of claim 2, wherein the second voltage wiring has a second main voltage line extending in the first direction and a second sub voltage lines extending in the second direction,
the second sub voltage line is disposed between the first stage and the second stage or between the third stage and the fourth stage.

4. The display device of claim 3, wherein
the first main voltage line, the second main voltage line and the first sub voltage line include a same material and are disposed at a same layer as each other, and
the second sub voltage line includes a different material from the first main voltage line, the second main voltage line and the first sub voltage line.

5. The display device of claim 4, wherein
the second sub voltage line is connected to the second main voltage line via a contact assistance, and
the contact assistance connects the second main voltage line and the second sub voltage line through a first contact hole and a second contact hole.

6. The display device of claim 3, wherein the first sub voltage line and the second sub voltage line overlap each other in a plan view.

7. The display device of claim 3, wherein
a length of the first sub voltage line of the first voltage wiring and a length of the second sub voltage line of the second voltage wiring are different from each other.

8. The display device of claim 3, wherein
the plurality of gate lines cross the first main voltage line and the second main voltage line.

9. The display device of claim 2, wherein the second voltage wiring is disposed at the second side of the gate driver.

10. The display device of claim 2, wherein
the first and second voltage wirings are disposed between the gate driver and the plurality of pixels in a plan view.

11. The display device of claim 2, wherein a present stage of the plurality of stages comprises:
a first output terminal for outputting a gate signal;
a second output terminal for outputting a carry signal;
a first transistor, which includes an input terminal connected to the clock signal wiring, and an output terminal connected to the first output terminal;
a second transistor, which includes an input terminal connected to the first voltage wiring, and an output terminal connected to the first output terminal; and
an eleventh transistor, which includes an input terminal connected to the second voltage wiring, and an output terminal connected to the second output terminal.

12. The display device of claim 11, wherein the present stage further comprises:
a sixth transistor, which includes an input terminal connected to the second voltage wiring, and an output terminal connected to a control electrode of the first transistor, and wherein a control terminal of the sixth transistor is connected to a third input terminal receiving a carry signal from a stage after the present stage among the plurality of stages.

13. The display device of claim 11, wherein the present stage further comprises:
a tenth transistor, which includes an input terminal connected to the second voltage wiring, and an output terminal connected to a control electrode of the first transistor, and
wherein a control terminal of the tenth transistor is connected to a control terminal of the eleventh transistor.

14. The display device of claim 11, wherein the present stage further comprises:
a fourth transistor, which includes an output terminal connected to a control electrode of the first transistor, and a control terminal connected to a first input terminal receiving a carry signal from a stage before the present stage among the plurality of stages.

15. The display device of claim 11, wherein the present stage further comprises:
a ninth transistor, which includes an input terminal connected to the first voltage wiring, and an output terminal connected to a control electrode of the first transistor, and
wherein a control terminal of the ninth transistor is connected to a second input terminal receiving a carry signal from a stage after the present stage among the plurality of stages.

16. The display device of claim 11, wherein the present stage further comprises:
a tenth transistor, which includes an input terminal connected to the second voltage wiring, and an output terminal connected to a control electrode of the first transistor, and
wherein a control terminal of the tenth transistor is connected to a control terminal of the eleventh transistor.

17. The display device of claim 11, wherein the present stage further comprises:
a fourth transistor, which includes an output terminal connected to a control electrode of the first transistor, and a control terminal connected to a first input terminal receiving a carry signal from a stage before the present stage among the plurality of stages.

18. The display device of claim 1, wherein a second sub clock signal line of a second clock signal wiring is disposed between the second stage and the third stage.

19. The display device of claim 18, wherein the first sub clock signal line of a first clock signal wiring is connected to the second stage, and the second sub clock signal line of a second clock signal wiring is connected to the third stage.

20. The display device of claim 18, wherein the first sub clock signal line is disposed adjacent to the second stage, and the second sub clock signal line is disposed adjacent to the third stage.

21. The display device of claim 1, wherein the first direction and the third direction are the same direction and the second direction is opposite to the fourth direction.

* * * * *